United States Patent [19]
Miyamoto et al.

[11] Patent Number: 5,365,098
[45] Date of Patent: Nov. 15, 1994

[54] NON-VOLATILE SEMICONDUCTOR MEMORY HAVING IMPROVED ERASURE CHARACTERISTICS

[75] Inventors: Junichi Miyamoto, Kanagawa; Kuniyoshi Yoshikawa, Tokyo; Kiyomi Naruke, Kanagawa, all of Japan

[73] Assignee: Kabushiki Kaisha Toshiba, Kanagawa, Japan

[21] Appl. No.: 963,622

[22] Filed: Oct. 20, 1992

[30] Foreign Application Priority Data

Oct. 24, 1991 [JP] Japan .................... 3-303830

[51] Int. Cl.⁵ ............... H01L 29/68; H01L 29/78
[52] U.S. Cl. ................... 257/316; 257/314; 257/315
[58] Field of Search .............. 257/314, 315, 316

[56] References Cited

U.S. PATENT DOCUMENTS 4,947,221  8/1990  Stewart et al. ............... 257/316

FOREIGN PATENT DOCUMENTS 0287031  10/1988  European Pat. Off. .
0329569   8/1989  European Pat. Off. .
0339586  11/1989  European Pat. Off. .
60-153167  8/1985  Japan ..................... 257/316
61-163660  7/1986  Japan ..................... 257/316

OTHER PUBLICATIONS

Patent Abstracts of Japan, vol. 11, No. 20 (E–472) (2467) Jan. 20, 1987, and Japanese Patent Application No. 61-190981, Aug. 25, 1986.
Patent Abstracts of Japan, vol. 13, No. 74 (E–717) Feb. 20, 1989, and Japanese Patent Application No. 63-255964, Oct. 24, 1988.

*Primary Examiner*—Ngan Van Ngo
*Attorney, Agent, or Firm*—Finnegan, Henderson, Farabow, Garrett & Dunner

[57] ABSTRACT

A floating gate is formed via a first gate insulating film over the channel region between source and drain regions which are formed in a semiconductor substrate. A control gate is formed via a second gate insulating film over the floating gate. A low impurity concentration semiconductor region is formed on the side of the control gate which faces the floating gate. When erasing, a depletion layer is produced in this low impurity concentration region and further saturates the erase characteristic for the erasure time by decreasing the capacitance between the control gate and the floating gate.

17 Claims, 5 Drawing Sheets

NON-VOLATILE SEMICONDUCTOR MEMORY HAVING IMPROVED ERASURE CHARACTERISTICS

BACKGROUND OF THE INVENTION

1. Field of the Invention

The present invention relates generally to a non-volatile semiconductor memory, and more specifically, the to a Flash type Electrically Erasable and Programmable Read Only Memory (Flash EEPROM) capable of substantially simultaneously erasing all data stored therein using an electrical signal.

2. Description of the Prior Art

An Erasable and Programmable Read Only Memory (EPROM) has been used in, for example, microcomputers as a program memory. The EPROM needs ultraviolet light To erase all data stored therein. Recently, the EPROM is being replaced with the Flash EEPROM because there is no need in the Flash EEPROM system to use ultraviolet light To erase the data stored therein. The Flash EEPROM uses an electrical signal as a substitute for the ultraviolet light of the EPROM.

FIG. 1 is a cross-sectional view showing a memory cell of a conventional Flash EEPROM.

In the conventional Flash EEPROM, source region 10 and drain region 11 are formed in P-type silicon semiconductor substrate 12. Floating gate 13 is formed over the channel region between source region 10 and drain region 11, on first gate insulating film 14. Control gate 15 is formed over the floating gate 13 and on second gate insulating film 16. The floating gate 13 is electrically isolated from other electrodes by the first and the second insulating films 16 and 14.

FIG. 2 is a circuit diagram of a part of the Flash EEPROM.

A plurality of memory cells 20a, 20b, 20c and 20d are arranged as shown in FIG. 2. Drain electrodes of the memory cells 20a and 20c are connected to one of the bit lines 21a, and drain electrodes of the memory cells 20b and 20d are connected to another bit line 21b. The bit lines 21a and 21b are connected to sense amplifier 22. Bit lines 21a and 21b are selected by MOS transistors 23a and 23b. Each of transistors 23a and 23b are inserted into one of the bit line 21a and 21b respectively and gate electrodes of the transistors 23a and 23b are supplied with a part of an address signal. Control gates of the memory cells 20a and 20b are mutually connected and function as one of the word lines 24a. Similarly, control gates of the memory cells 20c and 20d are mutually connected and function as another one of the word lines 24b. Word lines 24a and 24b are supplied with the other part of the address signal.

Operation of the conventional Flash EEPROM is as follows.

When writing data to the cell, a high voltage such as 10 V is impressed on the control gate 15 and on the drain region 11, and grounded voltage is impressed on the source region 10. By doing this, electrons flow from source region 10 and are accelerated in the channel region. Then, a portion of the electrons become hot electrons and are injected into the floating gate 13 via the first gate insulating film 14. The total amount of electrons to be injected is determined by the potential of the floating gate 13.

Then, the threshold voltage Vth of the memory cell, which is controlled by the total amount of injected electrons, increases, and the presence or absence of the threshold voltage variation component $\Delta V_{th}$ is made to correspond to data levels 1 or 0. Generally, it is desirable that the threshold voltage should shift greatly with a low impressed voltage and short writing time.

On the other hand, data erase is executed by emitting the injected electrons from the floating gate 13. For this purpose, a high voltage such as 10 V is impressed on the source region 10, and a grounded voltage is impressed on the control gate 15.

The characteristics of these injection and emission of electrons are determined by the potential difference between the floating gate 13 and the source region 10. Namely, if the potential difference is great, the velocity of the injection into the floating gate 13 or the emission from the floating gate 13 is rapid. The potential difference between the floating gate 13 and the source region 10 is determined by the voltage difference between the source region 10 and the control gate 15, and by the ratio of the capacitance Cs formed between the source region 10 and the floating gate 13 to the capacitance C1 formed between the floating gate 13 and the control gate 15. The potential difference between the floating gate 13 and the source region 10 is expressed as follows, taking the source region voltage as Vs and the floating gate voltage as Vfg. Capacitance C2 is the capacitance between the floating gate 13 and the channel region.

$$Vs - Vfg = (1 - Cs/(Cs + C1 + C2)) \quad Vs + Qf/(Cs + C1 + C2) \tag{1}$$

Here, Qf is the charge stored in the floating gate.

Due to the electrons injected to the floating gate 13, the threshold voltage variation component $\Delta V_{th}$ is also expressed as follows.

$$\Delta V_{th} = -Qf/C1 \tag{2}$$

FIG. 3 shows erase characteristic curves of the conventional memory cell taking the initial value of Vth as 4 V.

When the conventional memory cells are used in a Flash EEPROM array, over-erasure becomes a problem. Namely, erase characteristics of the memory cells 20a, 20b, 20c and 20d are different from each other due to structural parameters of the memory cells, such as the dispersion of the channel width, length and concentration, the insulating (oxide) film thickness and the superimposed area of the control gate and the floating gate of the memory cells. That is to say, when one of the memory cells is sufficiently erased, another memory cell might have been already over-erased and its threshold voltage Vth falls below 0 V. Here, the case of desiring to detect OFF when Vth is above the voltage of the selected word line is studied. At this time, if cell 20a, for example, is in the over-erased state, and its threshold value is below 0 V, the current flows in the selected bit line even if the potential of non-selected word line 24a is 0 V. That is to say, it cannot be sensed that cell 20a is OFF. Therefore the memory itself becomes defective.

In order prevent this over-erasure, the design must be such that, at the point at which the cell in which erasure is slowest exceeds the maximum Vth (VthE) which can be sensed as erased, the cell in which erasure is fastest should not exceed the point of Vth=0.

The speed of erasure is greatly influenced by the structural parameters. Controlling randomness in these becomes increasingly difficult with cell miniaturization and the large capacity memories.

On the other hand, when considered from the circuit point of view, if VthE is set high, the risk of over-erasure will be reduced. However, the power source margin will deteriorate and, in particular, the cell current will decrease. Therefore, deterioration of access time can be predicted. Also, reduction of the power source voltage due to future device miniaturization cannot be accommodated.

SUMMARY OF THE INVENTION

It is an object of the present invention to provide an improved non-volatile semiconductor memory.

It is another object of the present invention to provide a non-volatile semiconductor memory that reduces the randomness of the erasure characteristic due to randomness of the structural parameters.

It is a further object of the present invention to provide an improved method for operating a non-volatile semiconductor memory.

To accomplish the objects described above, the present invention provides a non-volatile semiconductor memory comprising: a semiconductor substrate of first conductivity type having a main surface; a source region of second conductivity type formed on the main surface; a drain region of second conductivity type formed on the main surface apart from the source region; a channel region between the source and the drain regions; a floating gate electrode formed over the channel region and electrically isolated from the substrate, the source region and the drain region; and a control gate electrode formed over the floating gate electrode and isolated from the floating gate electrode; wherein the control gate electrode has means for reducing a capacitance between the floating gate electrode and the control gate electrode when a voltage is applied between the source region and the control gate electrode.

The invention is also directed to a method for operating a non-volatile semiconductor memory which includes a semiconductor substrate of first conductivity type having a main surface; a source region of second conductivity type formed on the main surface; a drain region of second conductivity type formed on the main surface apart from the source region; a channel region between the source and the drain regions; a first insulating film formed on the channel region; a floating gate electrode formed on the first insulating film; a second insulating film formed on the floating gate electrode; and a control gate electrode formed on the second insulating film; said method comprising the steps of: applying a voltage across the first insulating film and the second insulating film; and forming a depletion layer, in contact with the second insulating film, in one of the floating gate electrode and the control gate electrode.

The invention is further directed to a method for manufacturing a non-volatile semiconductor memory, comprising the steps of: preparing a semiconductor substrate of first conductivity type having source and drain regions, each of second conductivity type, and having a channel region between the source and the drain regions; forming a first insulating film on the channel region; forming a floating gate electrode on the first insulating film; forming a second insulating film on the floating gate electrode; forming a layer of polycrystalline silicon on the second insulating film; and subjecting the polycrystalline silicon layer to ion implantation to form a control gate electrode having a lower layer in contact with the second insulating film and an upper layer having a higher impurity concentration than the lower layer.

The invention is still further directed to a method for manufacturing a method of manufacturing a non-volatile semiconductor memory, comprising the steps of: preparing a semiconductor substrate of first conductivity type having source and drain regions, each of second conductivity type, and having a channel region between the source and the drain regions; forming a first insulating film on the channel region; forming a layer of polycrystalline silicon on the first insulating film; subjecting the polycrystalline silicon layer to ion implantation to form a floating gate electrode having a lower layer in contact with the first insulating film and an upper layer having a lower impurity concentration from the lower layer; forming a second insulating film on the upper layer of the floating gate electrode; and forming a control gate electrode on the second insulating film.

BRIEF DESCRIPTION OF THE DRAWINGS

The accompanying drawings, which are incorporated in and constitute a part of the specification, illustrate embodiments of the invention, and, together with the description, serve to explain the principles of the invention. Referring now to the drawings, like reference characters designate like or corresponding parts throughout the several views. Of the drawings.

DETAILED DESCRIPTION OF THE PREFERRED EMBODIMENTS

According to the following embodiments of the invention, at the point when the potential of the floating gate exceeds a certain value, the capacitance between the floating gate and the control gate is caused to decrease by generating a depletion layer in the floating gate or in the control gate in contact with a insulating film formed therebetween. Accordingly, the potential difference between the floating gate and the source region is reduced, and the erase characteristic is made further saturated for the erasure time.

First Embodiment

Figure 1:
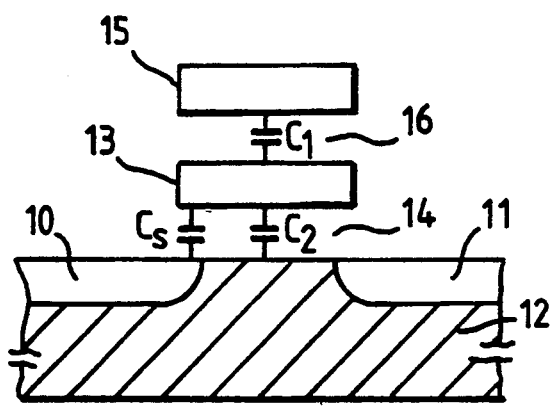
FIG. 1 is a cross-sectional view showing a memory cell of a conventional Flash EEPROM.
Figure 2:
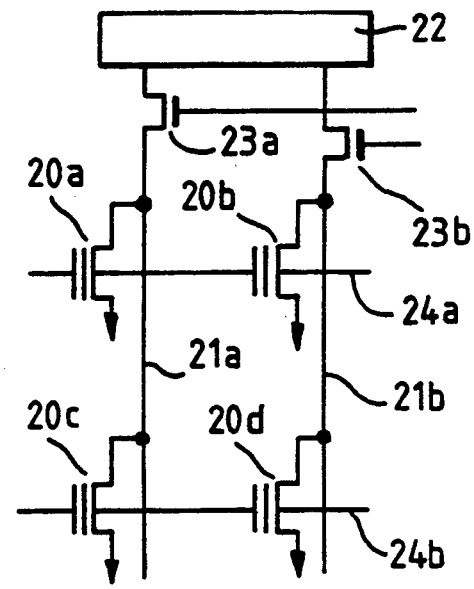
FIG. 2 is a circuit diagram of a part of the Flash EEPROM.
Figure 3:
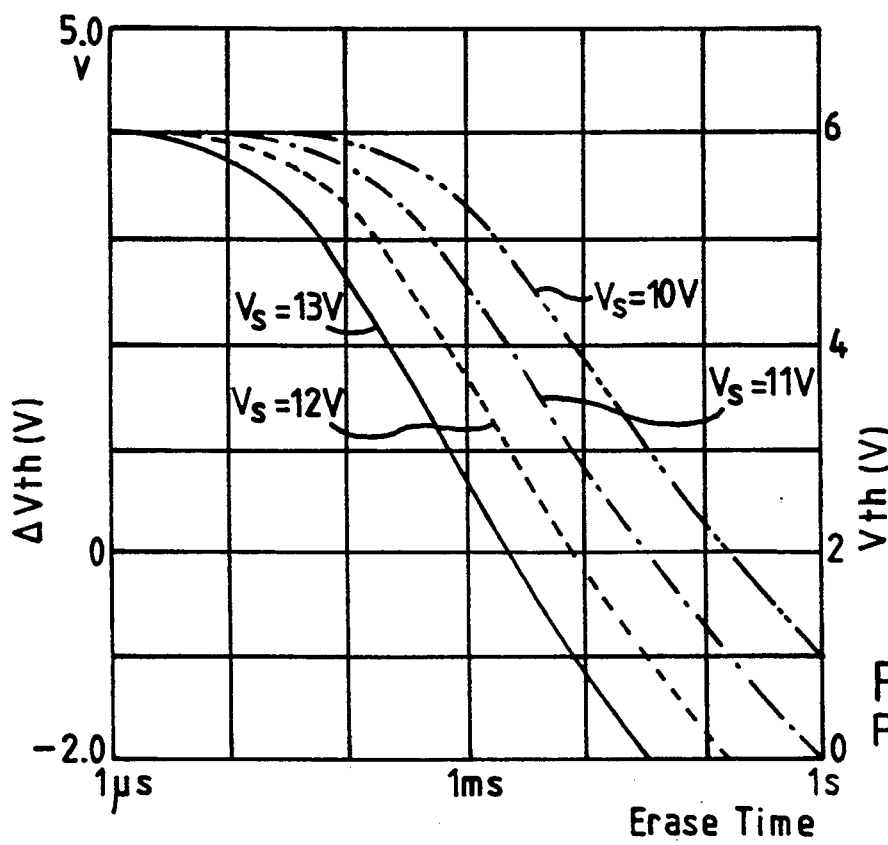
FIG. 3 graphically illustrates erase characteristic curves of the conventional memory cell shown in FIG. 1.
Figure 4:
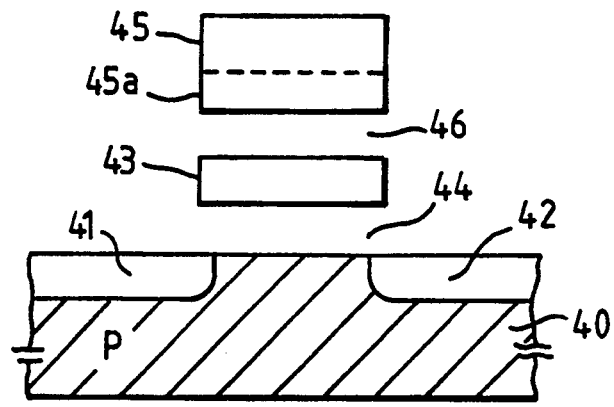
FIG. 4 is a cross-sectional view showing a memory cell according to the first embodiment of this invention.

First embodiment is explained using FIGS. 4 to 10. FIG. 4 is a cross-sectional view showing a memory cell according to the first embodiment of this invention.

According to this embodiment, P-type silicon semiconductor is used for semiconductor substrate 40, and N-type source region 41 and drain region 41 are formed in its surface region. Then, floating gate 43, composed of polycrystalline silicon, hereafter polysilicon, is formed over the channel region between the source and drain regions, on a first gate insulating film 44. Control gate 45, made of polysilicon, is formed over floating gate 43, on a second gate insulating film 46. P-type polysilicon layer 45a, which is a low impurity concentration semiconductor region, is formed in control gate 45 facing floating gate 43.

Figure 5:
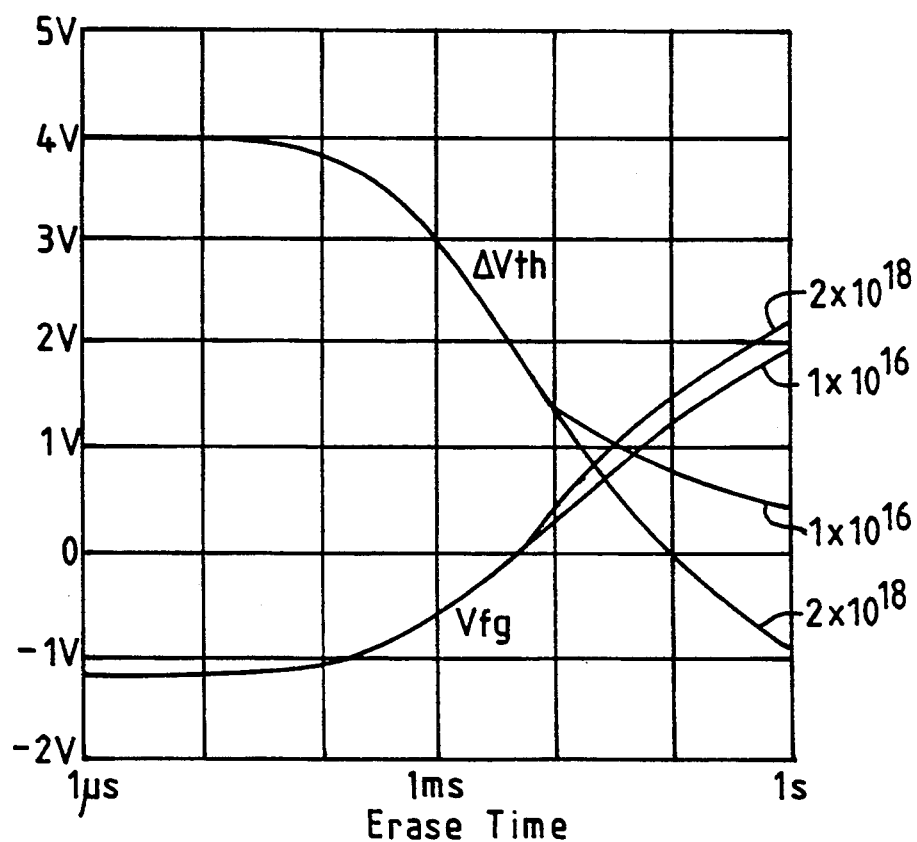
FIG. 5 graphically illustrates erase characteristic curves of the memory cell according to the first embodiment of this invention.

FIG. 5 is the erase characteristic curves of the memory cell shown in FIG. 4.

Figure 6:
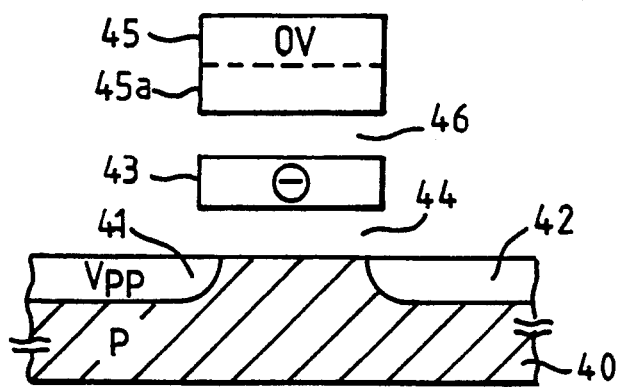
FIGS. 6 and 7 are drawings explaining the functions of the memory cell according to the first embodiment of this invention.

These show the variation of $\Delta V_{th}$, taking the impurity concentration of P-type polysilicon layer 45a as a parameter and varying it from $1 \times 10^{16}$ to $2 \times 10^{18}$ Cm$^{-3}$. Also, 0 V is impressed on the control gate 45 and 10.8 V is impressed on source region 41, and the potential $V_{fg}$ of floating gate 41 is shown. As the result of electrons being emitted to the source region, the potential $V_{fg}$ gradually increases from a negative value. The effect of the concentration of the P-type polysilicon layer 45a on the erase characteristic depends on the capacitance C1 between the floating gate 43 and the control gate 45 of the memory cell with the structure in FIG. 4. In the state in which the floating gate 43 is negative with regard to the control gate, as shown in FIG. 6, the interfacial state of P-type polysilicon layer 45a in the control gate 45 in the vicinity of the second gate oxide film 46 is a state of accumulation, that is to say it is in a state in which multiple majority carriers are present in the interface. Therefore, capacitance C1 formed between the two gates is determined only by the thickness of the second gate insulating film 46 and the film area between the two gates. That is to say, $$C1 = \epsilon ox(L \times Wo)/tox2 = Cox \qquad (3)$$

Here, L is the channel length, Wo is the length of the facing portions of these gates, $\epsilon ox$ is the dielectric constant of the second gate oxide film 46 and tox2 is the second gate insulating film thickness. That is to say, Cox expresses C1 when P-type polysilicon 45a is in the accumulation state.

Figure 7:
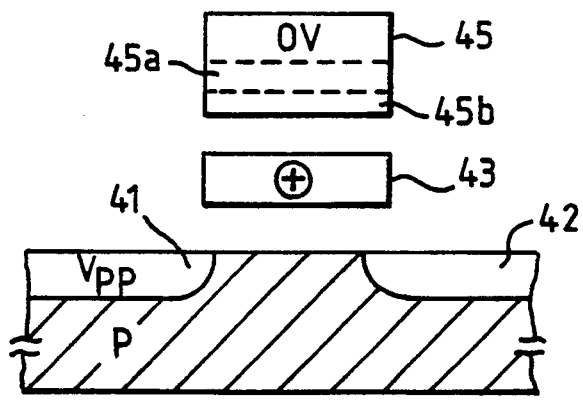

However, when the potential of the floating gate rises and exceeds a certain threshold value, Vo, as shown in FIG. 7, the P-type polysilicon layer 45a interface in the vicinity of the second gate oxide film 46 enters a depleted state. That is to say, depletion layer 45b is made at the polysilicon interface by a minority carrier attracted to floating gate 43, and since its capacitance enters into series with the oxide film capacity Cox, C1 becomes as follows.

$$C1 = Cox/(1 + 2 \times Cox^2 \times Vfg/q \times N \times \epsilon si)^{0.5} \qquad (4)$$

Here, q is the charge, N is the impurity concentration of the P-type polysilicon layer 45a, and $\epsilon si$ is the dielectric constant of silicon. From this Equation, when $V_{fg}$ increases, C1 sharply decreases due to depletion layer 45b in polysilicon layer 45a in the vicinity of the second gate oxide film 46.

Figure 8:
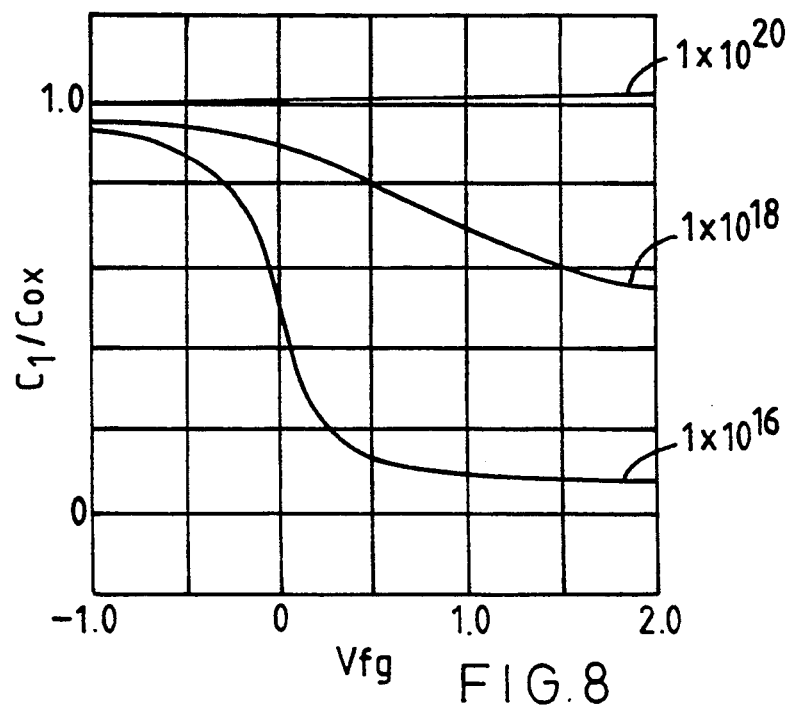
FIG. 8 graphically illustrates variation curves of the capacitance formed between the control gate and the floating gate of the memory cell according to the first embodiment of this invention.

FIG. 8 shows this result numerically analysed by a Boltzmann distribution, which is more accurate than depletion approximation, taking the vertical axis as C1/Cox and the horizontal axis as $V_{fg}$ and taking the impurity concentration of P-type polysilicon layer 45a. In FIG. 8, the threshold voltage Vo is taken as 0 V.

The sharp decrease of C1 accelerates the following of the source region 41 by the floating gate 43, as predicted from Equation (1). Thus the potential of the floating gate 43 is further attracted to the source side. Therefore the electric field between the floating gate 43 and the source region 41 is relaxed, and the emission of electrons from the floating gate 43 is suppressed. Fine adjustment of the erasure characteristic depends on impurity concentration N of P-type polysilicon layer 45a. As can be seen from FIG. 5, the erase characteristic for time also saturates.

On the other hand, when the memory cell is not under the erase operation, the potential of the floating gate 43 will not exceed the threshold voltage Vo and thus a depletion layer will not be formed. Namely, when Vo=0 V is taken and the memory cell is under writing operation or reading operation, the potential of the floating gate 43 is below the potential of the control gate 45. That is to say, a depletion layer does not occur in these states, and the characteristic is no different from the conventional memory cell without a depletion layer.

Therefore, when using this embodiment of the present invention, the cell does not enter the over-erased state, even if there is randomness of the erasure characteristic due to the fluctuation of the structural parameters, and thus a cell structure which has the same writing and reading characteristics as in the conventional memory cell can be achieved.

Next, the manufacturing method for the memory cell according to this embodiment is described with reference To FIGS. 9(a)–9(c).

Figure 9A:
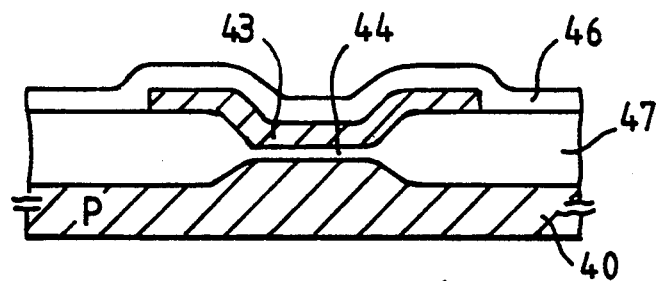
FIGS. 9(a), 9(b) and 9(c) are cross-sectional views showing the steps for manufacturing the first embodiment of this invention.
Figure 9B:
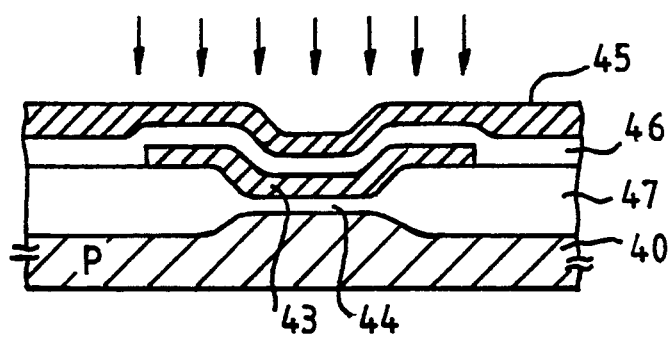
Figure 9C:
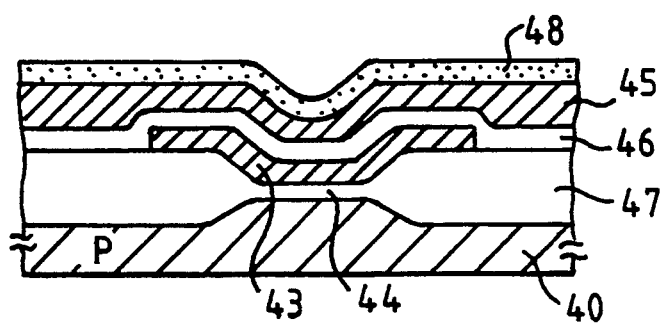

FIGS. 9(a)–9(c) are cross-sectional views, which cut perpendicular to the view of FIG. 4, for manufacturing processes focussing in particular on the low impurity concentration semiconductor region 45a of the memory cell.

Thin first gate insulating film 44 and thick field insulating film 47 are formed on the surface of P-type silicon semiconductor substrate 40 by oxidizing that surface. A first polysilicon film is deposited over these oxide films, and floating gate 43 is formed by patterning the first polysilicon film using known technology. Then, the second gate insulating film 46 is formed over the semiconductor substrate 40 including floating gate 43 (FIG. 9(a)).

Next, N-type impurity diffusion regions which become the source region 41 and drain region 42 (not shown in FIGS. 9(a)–9(c)) are formed by the normal method such as ion implantation technique. Next, after depositing a non-doped polysilicon film, control gate 45 is formed by patterning the non-doped polysilicon film. Then a P-type impurity, such as boron, is ion-implanted into this control gate with a selected accelaration energy, and annealing is carried out to activate this. The accelaration energy is selected so as to form a peak concentration near the surface of the control gate 45. By this means, a semiconductor region 45a (not shown) with a low impurity concentration is formed in the portion of the control gate 45 that is close to the floating gate 43. The portion close to the surface of the control gate becomes a semiconductor region with a high impurity concentration. The portion between these two regions becomes a region in which the impurity concentration varies with a gradient. Needless to say, there is not always a requirement for a concentration gradient here. After this, when required, second ion-implantation is carried out in the vicinity of the interface with the second gate oxide film in order to adjust threshold voltage Vo (FIG. 9(b)).

Then, in order to lower the resistance of the control gate 45 which functions as a word line of the Flash EEPROM, layer 48 made of refractory metal such as tungsten, molybdenum or their silicide is formed on the control gate 45 (FIG. 9(c)). As a method of forming the P-type polysilicon, instead of diffusing impurity after the deposition of non-doped polysilicon, it is also possible to form it by depositing P-type impurity doped polysilicon.

Figure 10:
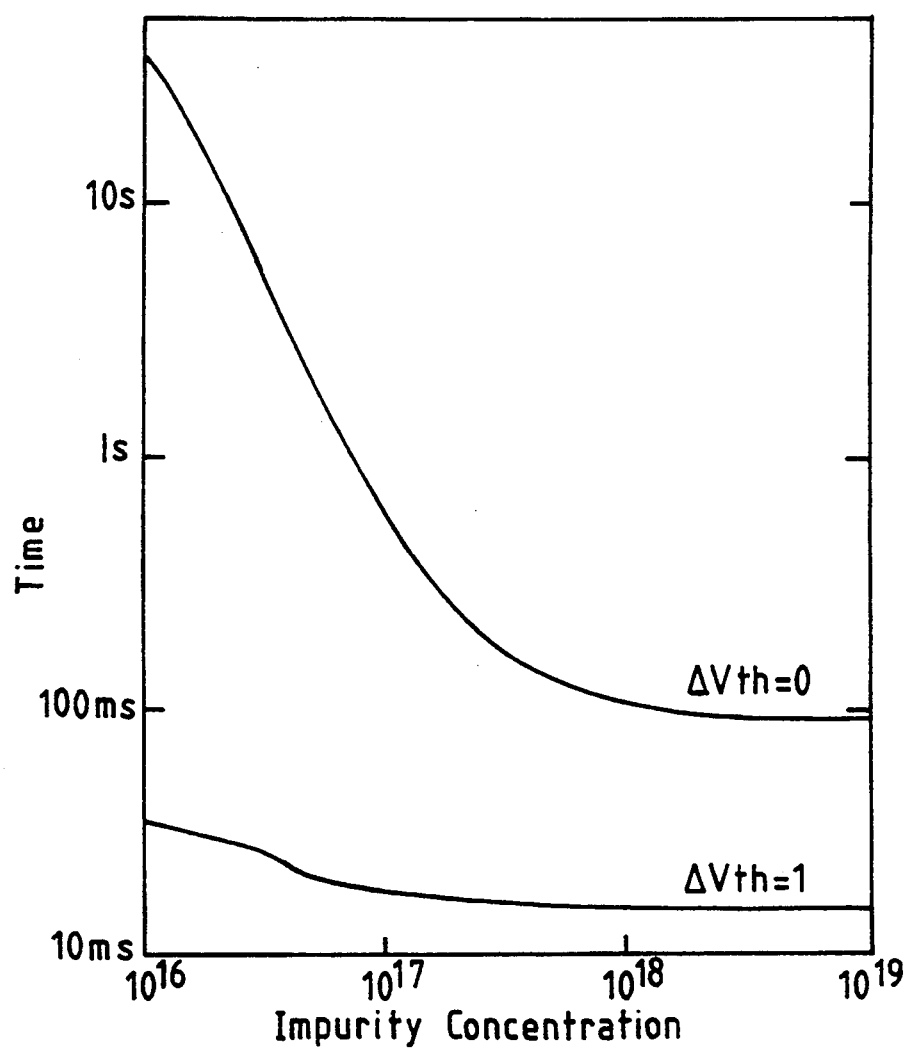
FIG. 10 graphically illustrates variation curves of the threshold voltage variation component of the memory cell according to the first embodiment of this invention.

FIG. 10 is characteristic curves illustrating the relationship between the impurity concentration of the region 45a and time which is needed for making the threshold voltage variation component $\Delta$Vth.

The semiconductor substrate used was a P-type silicon substrate with an impurity concentration of $1 \times 10^{18}$ cm$^{-3}$, and the source voltage Vs impressed was 10.8 V. In the Figure, the ratio of time needed for making 1 V for $\Delta$Vth to time needed for making 0 V for $\Delta$Vth under the impurity concentration $10^{18}$ cm$^{-3}$ is about 5 times. However, as the impurity concentration becomes less, this ratio rapidly becomes larger, and at $10^{16}$ cm$^{-3}$, although time needed for making 1 V for $\Delta$Vth only deteriorates about 2 times, the ratio reaches as much as 1000 times. Thus, since erasure is satisfactory at $\Delta$Vth about 1 V, this means that the erase characteristic hardly deteriorates and, moreover, the margin to over-erasure increases.

In this embodiment, characteristic variation is seen from an impurity concentration of $10^{19}$ cm$^{-3}$ and below. However, generally the variation is observed from about $1 \times 10^{20}$ cm$^{-3}$ and below.

Second Embodiment

Figure 11:
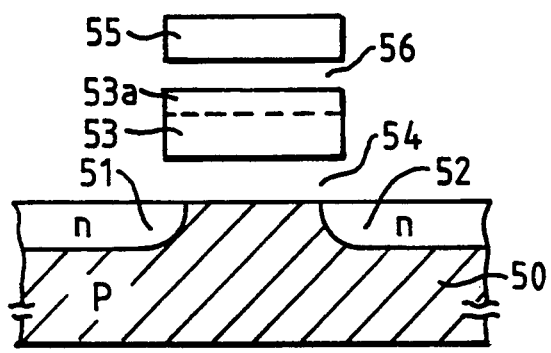
FIG. 11 is a cross-sectional view showing a memory cell according to the second embodiment of this invention.

Next, a second embodiment is explained using FIG. 11.

FIG. 11 is a cross-section showing a memory cell according to the second embodiment of this invention.

In the first embodiment, the depletion layer 45b was formed in the control gate 45. In this embodiment, on the other hand, the depletion layer is formed in the floating gate, close to the control gate, and its periphery is depleted.

First, the N-type impurity diffusion regions of source region 51 and drain region 52 are formed in P-type silicon semiconductor substrate 50. Floating gate 53, made of polysilicon, is formed over semiconductor substrate 50 between these two regions, on first gate insulating film 54. Then, control gate 55, made of polysilicon, is formed over floating gate 53, on second gate insulating film 56.

In this embodiment, in order to form a depletion layer by increasing potential of the floating gate 53, either N-type low impurity concentration region 53a may be provided on the control gate 55 side of floating gate 53 or the whole of the floating gate 53 may be made of low impurity concentration. The same characteristics as in FIG. 10 can be obtained if P-type is replaced by N-type. In this embodiment, in accordance with one method of forming the semiconductor region 53a with a low impurity concentration, N-type impurity is implanted into the non-doped polysilicon layer composing the floating gate 53 with a selected accelaration energy and activating this by annealing. The accelaration energy is selected so as to form a peak concentration near the interface between the floating gate 53 and the first gate insulating film 54. Thus, the region facing the control gate 53 is made of low impurity concentration and the region facing the semiconductor substrate is made of high impurity concentration.

It is also possible to use a method of depositing N-type polysilicon with low impurity concentration on the semiconductor substrate 50 via the first gate insulating film and doping P-type impurity into the surface region of this to reduce the N-type impurity concentration of this region.

Third Embodiment

Figure 12:
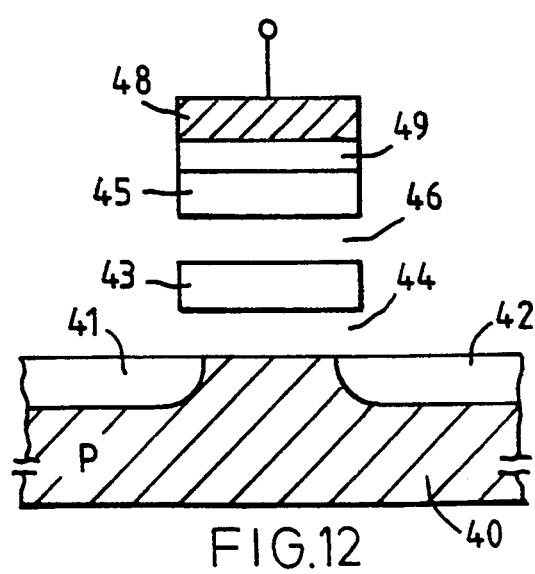
FIG. 12 is a cross-sectional view showing a memory cell according to the third embodiment of this invention.

The following is a description of a third embodiment with reference to FIG. 12.

Normally, the control gate functions as the word line in the memory cell array, and it acts as the wiring in a semiconductor integrated circuit. For this reason, when polysilicon having a low impurity concentration region is used in the control gate such as in the first embodiment, the wiring resistance increases and creates the problem of signal delay. In order to reduce this resistance, as shown in FIG. 9(c), a layer made of refractory metal is formed on the polysilicon composing the control gate. However, there is a possibility of making a Schottky junction at the interface between the refractory layer and the low impurity concentration polysilicon, so that sometimes the initial aim cannot be achieved.

FIG. 12 is a cross-sectional view showing a memory cell according to the third embodiment of this invention.

In FIG. 12, the same reference numerals are used for same elements as the elements shown in FIGS. 4 and 9.

In this embodiment, the whole of floating gate 45 is made with a P-type low impurity concentration. Buffer layer 49 is formed between the control gate 45 and the refractory metal layer 48 in order to prevent making a Schottky junction. For buffer layer 49, it is possible to use, for example, polysilicon having high impurity concentration with the same conductivity type as low impurity concentration region 45.

It is also possible to form the buffer layer 49 and the low impurity concentration control gate 45 of the same polysilicon, and to make a concentration gradient so that the impurity concentration is lower on the floating gate side and higher on the refractory metal layer side. At the same time, it is also possible to make a concentration gradient so that the impurity concentration on the control gate side of the floating gate 43 is low and the impurity concentration on the semiconductor substrate side is high.

This invention has been described above for Flash EEPROM of the type in which electrons are batch-emitted from the floating gate. However, the state in which electrons have been injected into the floating gate is defined as erasure, and this invention is also applicable to an EEPROM of the type in which electrons are batch-injected. In this case, the bias state is the reverse of the above, and the control gate is positively biased with regard to the source or drain. Moreover, since the floating gate becomes negative with the injection of electrons, N-type is adopted for the control gate as the low concentration impurity in which a depletion layer is formed for negative, and this may be formed at the gate oxide film interface. In this case, if a depletion layer which is formed in the floating gate is used, this may be formed by P-type.

Also, in the first embodiment, if N-type polysilicon is used instead of P-type polysilicon in the low impurity concentration semiconductor region, over-writing can be prevented.

The present invention has been described with respect to specific embodiments. However, other embodiments based on the principles of the present invention should be obvious to those of ordinary skill in the art. Such embodiments are intended to be covered by the claims.

What is claimed is:

1. A non-volatile semiconductor memory comprising
a semiconductor substrate of a first conductivity type having a surface;
a source region of a second conductivity type on the surface;
a drain region of the second conductivity type on the surface;
a channel region between the source and the drain regions;
a floating gate electrode over the channel region; and
a control gate electrode including polycrystalline silicon of the first conductivity type, means for reducing a capacitance between the floating gate electrode and the control gate electrode when a voltage is applied between the source region and the control gate electrode, the reducing means comprising a depletion layer at a side of the control gate electrode facing the floating gate electrode, wherein the control gate electrode comprises a floating gate electrode side and an upper side on the floating gate electrode side, and an impurity concentration of the floating gate electrode side is lower than an impurity concentration of the upper side.

2. The non-volatile semiconductor memory of claim 1, wherein the impurity concentration of the floating gate electrode side is not greater than $1 \times 10^{20}$ cm$^{-3}$.

3. The non-volatile semiconductor memory of claim 2, wherein The impurity concentration of the floating gate electrode side is not greater than $1 \times 10^{19}$ cm$^{-3}$.

4. The non-volatile semiconductor memory of claim 1, wherein the impurity concentration of the control gate electrode is not greater than $1 \times 10^{20}$ cm$^{-3}$.

5. The non-volatile semiconductor memory of claim 1, wherein an impurity concentration of the control gate electrode is not greater than $1 \times 10^{19}$ cm$^{-3}$.

6. The non-volatile semiconductor memory of claim 1, further comprising means for reducing a resistance of the control gate electrode.

7. The non-volatile semiconductor memory of claim 6, wherein the resistance reducing means comprises a metal layer in contact with the control gate electrode.

8. The non-volatile semiconductor memory of claim 7, the control gate electrode further comprising means for preventing the formation of a Shottky barrier between the capacitance reducing means and the metal layer.

9. A non-volatile semiconductor memory comprising:
a semiconductor substrate of a first conductivity type having a surface;
a source region of a second conductivity type on the surface;
a drain region of the second conductivity type on the surface;
a channel region between the source and the drain regions;
a floating gate electrode over the channel region, the floating gate electrode including polycrystalline silicon of the second conductivity type, means for reducing a capacitance between the floating gate electrode and the control gate electrode when a voltage is applied between the source region and the control gate electrode, the reducing means comprises a depletion layer at a side of the floating gate electrode facing the control gate electrode; and
a control gate electrode electrically insulated from the floating gate electrode,
wherein the floating gate electrode comprises a channel side and an upper side on the channel side, and an impurity concentration of the upper side is lower than an impurity concentration of the channel side.

10. The non-volatile semiconductor memory of claim 9, wherein the impurity concentration of the upper side is not greater than $1 \times 10^{20}$ cm$^{-3}$.

11. The non-volatile semiconductor memory of claim 10, wherein the impurity concentration of the upper side is not greater than $1 \times 10^{19}$ cm$^{-3}$.

12. The non-volatile semiconductor memory of claim 9, wherein the impurity concentration of the floating gate electrode is not greater than $1 \times 10^{20}$ cm$^{-3}$.

13. The non-volatile semiconductor memory of claim 9, wherein an impurity concentration of the floating gate electrode is not greater than $1 \times 10^{19}$ cm$^{-3}$.

14. A non-volatile semiconductor memory comprising:
a semiconductor substrate of a first conductivity type having a surface;
a source region of a second conductivity type on the surface;
a drain region of the second conductivity type on the surface;
a channel region between the source and the drain regions;
a floating gate electrode over the channel region; and
a control gate electrode of the first conductivity type semiconductor including a first portion opposing the floating gate electrode and a second portion separated from the floating gate electrode by the first portion, wherein an impurity concentration of the first portion is lower than an impurity concentration of the second portion.

15. A non-volatile semiconductor memory comprising:

a semiconductor substrate of a first conductivity type having a surface;

a source region of a second conductivity type on the surface;

a drain region of the second conductivity type on the surface;

a channel region between the source and the drain regions;

a floating gate electrode of the second conductivity type semiconductor over the channel region including a first portion opposing the channel region and a second portion separated from the channel region by the first portion, wherein an impurity concentration of the second portion is lower than an impurity concentration of the first portion; and a control gate electrode opposing the second portion.

16. A non-volatile semiconductor memory comprising:

a semiconductor substrate of a first conductivity type having a surface;

a source region of a second conductivity type on the surface;

a drain region of the second conductivity type on the surface;

a channel region between the source and the drain regions;

a floating gate electrode over the channel region; and a control gate electrode including a floating gate electrode side and an upper side on the floating gate electrode side, and an impurity concentration of the floating gate electrode side is lower than an impurity concentration of the upper side.

17. A non-volatile semiconductor memory comprising:

a semiconductor substrate of a first conductivity type having a surface;

a source region of a second conductivity type on the surface;

a drain region of the second conductivity type on the surface;

a channel region between the source and the drain regions;

a floating gate electrode over the channel region, including a channel side and an upper side on the channel side, and an impurity concentration of the upper side is lower than an impurity concentration of the channel side; and a control gate electrode electrically insulated from the floating gate electrode.

* * * * *